(12) United States Patent
Xu et al.

(10) Patent No.: US 11,195,721 B2
(45) Date of Patent: Dec. 7, 2021

(54) OHMIC CONTACTS AND METHODS FOR MANUFACTURING THE SAME

(71) Applicant: Princeton Optronics, Inc., Mercerville, NJ (US)

(72) Inventors: Guoyang Xu, Newtown, PA (US); Jean-Francois Seurin, Princeton Junction, NJ (US); Chuni Ghosh, West Windsor, NJ (US)

(73) Assignee: Princeton Optronics, Inc., Mercerville, NJ (US)

( * ) Notice: Subject to any disclaimer, the term of this patent is extended or adjusted under 35 U.S.C. 154(b) by 53 days.

(21) Appl. No.: 16/956,994

(22) PCT Filed: Jan. 14, 2019

(86) PCT No.: PCT/US2019/013518
§ 371 (c)(1),
(2) Date: Jun. 22, 2020

(87) PCT Pub. No.: WO2019/143569
PCT Pub. Date: Jul. 25, 2019

(65) Prior Publication Data
US 2020/0350175 A1    Nov. 5, 2020

Related U.S. Application Data

(60) Provisional application No. 62/617,699, filed on Jan. 16, 2018, provisional application No. 62/668,476, filed on May 8, 2018.

(51) Int. Cl.
*H01L 21/285*    (2006.01)
*H01L 21/324*    (2006.01)
(Continued)

(52) U.S. Cl.
CPC ...... *H01L 21/28575* (2013.01); *H01L 21/324* (2013.01); *H01L 29/452* (2013.01);
(Continued)

(58) Field of Classification Search
CPC ............. H01L 21/28575; H01L 21/324; H01L 21/76838; H01L 21/76841;
(Continued)

(56) References Cited

U.S. PATENT DOCUMENTS 4,024,569 A * 5/1977 Hawrylo ............... H01L 29/452
372/44.01
4,179,534 A * 12/1979 Chang ............... H01L 21/28575
438/558

(Continued)

FOREIGN PATENT DOCUMENTS

JP    2005260044 A    9/2005
WO    2017027004 A1    2/2017

OTHER PUBLICATIONS

International Search Report with Written Opinion for related Application No. PCT/US2019/013518 dated May 8, 2019 (13 Pages).

*Primary Examiner* — Mary A Wilczewski
(74) *Attorney, Agent, or Firm* — Michael Best and Friedrich LLP

(57) ABSTRACT

Ohmic contacts, including materials and processes for forming n-type ohmic contacts on n-type semiconductor substrates at low temperatures, are disclosed. Materials include reactant layers, n-type dopant layers, capping layers, and in some instances, adhesion layers. The capping layers can include metal layers and diffusion barrier layers. Ohmic contacts can be formed on n-type semiconductor substrates at temperatures between 150 and 250° C., and can resist degradation during operation.

20 Claims, 1 Drawing Sheet

(51) Int. Cl.
*H01L 29/45* (2006.01)
*H01S 5/042* (2006.01)
*H01S 5/183* (2006.01)
*H01L 21/768* (2006.01)

(52) U.S. Cl.
CPC ...... *H01S 5/0421* (2013.01); *H01L 21/76841* (2013.01); *H01L 21/76853* (2013.01); *H01L 21/76855* (2013.01); *H01L 21/76858* (2013.01); *H01L 29/454* (2013.01); *H01S 5/183* (2013.01)

(58) Field of Classification Search
CPC ......... H01L 21/76846; H01L 21/76853; H01L 21/76855; H01L 21/76858; H01L 29/452; H01L 29/454; H01S 5/0421; H01S 5/04252; H01S 5/183
See application file for complete search history.

(56) References Cited

U.S. PATENT DOCUMENTS

| | | | | |
|---|---|---|---|---|
| 4,188,710 A * | 2/1980 | Davey | ............... | H01L 21/28575 438/508 |
| 4,593,307 A * | 6/1986 | Rupprecht | ........ | H01L 21/28575 148/DIG. 140 |
| 4,673,593 A * | 6/1987 | Himoto | ................ | H01L 29/452 257/E21.172 |
| 4,849,802 A * | 7/1989 | Jackson | ............... | H01L 29/452 257/743 |
| 4,994,892 A * | 2/1991 | Zuleeg | ................ | H01L 29/452 257/742 |
| 4,998,158 A * | 3/1991 | Johnson | ............... | H01L 29/452 257/751 |
| 5,077,599 A * | 12/1991 | Yano | ................ | H01L 21/28575 257/753 |
| 5,179,041 A * | 1/1993 | Yano | ................ | H01L 21/28575 257/E21.172 |
| 5,288,456 A * | 2/1994 | Aboelfotoh | ............... | C22C 9/00 420/469 |
| 5,317,190 A * | 5/1994 | Fleischman | ........... | H01L 29/452 257/743 |
| 5,422,307 A * | 6/1995 | Ishii | ................ | H01L 23/53242 257/E23.162 |
| 5,523,623 A * | 6/1996 | Yanagihara | ....... | H01L 21/28575 257/745 |
| 5,646,069 A * | 7/1997 | Jelloian | ............ | H01L 21/28575 257/E21.172 |
| 5,767,007 A * | 6/1998 | Uchibori | ........... | H01L 21/28575 257/E21.172 |
| 6,326,294 B1 * | 12/2001 | Jang | ................... | H01L 21/28575 438/604 |
| 6,365,969 B1 * | 4/2002 | Yamaguchi | ....... | H01L 21/28575 257/744 |
| 6,469,319 B1 * | 10/2002 | Su | ......................... | H01L 21/441 257/103 |
| 6,614,115 B2 * | 9/2003 | Focht | ................... | H01L 21/0237 257/741 |
| 7,075,113 B2 * | 7/2006 | Wu | ......................... | H01L 33/40 257/766 |
| 9,887,131 B2 * | 2/2018 | Nishizawa | ......... | H01L 21/28575 |
| 2004/0058467 A1 | 3/2004 | Chirovsky et al. | | |
| 2007/0029568 A1 * | 2/2007 | Choo | ....................... | H01L 33/40 257/99 |
| 2009/0065811 A1 | 3/2009 | Chang et al. | | |
| 2009/0302470 A1 * | 12/2009 | Tada | ..................... | H01L 29/452 257/745 |
| 2011/0140173 A1 * | 6/2011 | Ramdani | .......... | H01L 29/66462 257/194 |
| 2012/0168803 A1 * | 7/2012 | Lee | ......................... | H01L 33/40 257/98 |
| 2012/0258591 A1 * | 10/2012 | Tamari | .............. | H01L 21/28575 438/654 |
| 2013/0221324 A1 * | 8/2013 | Lee | ......................... | H01L 33/40 257/13 |
| 2014/0097456 A1 | 4/2014 | Kawashima | | |
| 2014/0308766 A1 * | 10/2014 | Gaska | .................... | H01L 23/482 438/22 |
| 2015/0287602 A1 * | 10/2015 | Gaska | ................... | H01L 33/405 438/46 |
| 2018/0233881 A1 * | 8/2018 | Mathai | ................ | H01S 5/18313 |
| 2019/0131244 A1 * | 5/2019 | Hua | ................... | H01L 23/53266 |
| 2020/0303197 A1 * | 9/2020 | Nishikawa | ............ | H01L 29/452 |
| 2020/0350175 A1 * | 11/2020 | Xu | ..................... | H01L 21/28575 |
| 2021/0288159 A1 * | 9/2021 | Nishikawa | ........ | H01L 23/53266 |

\* cited by examiner

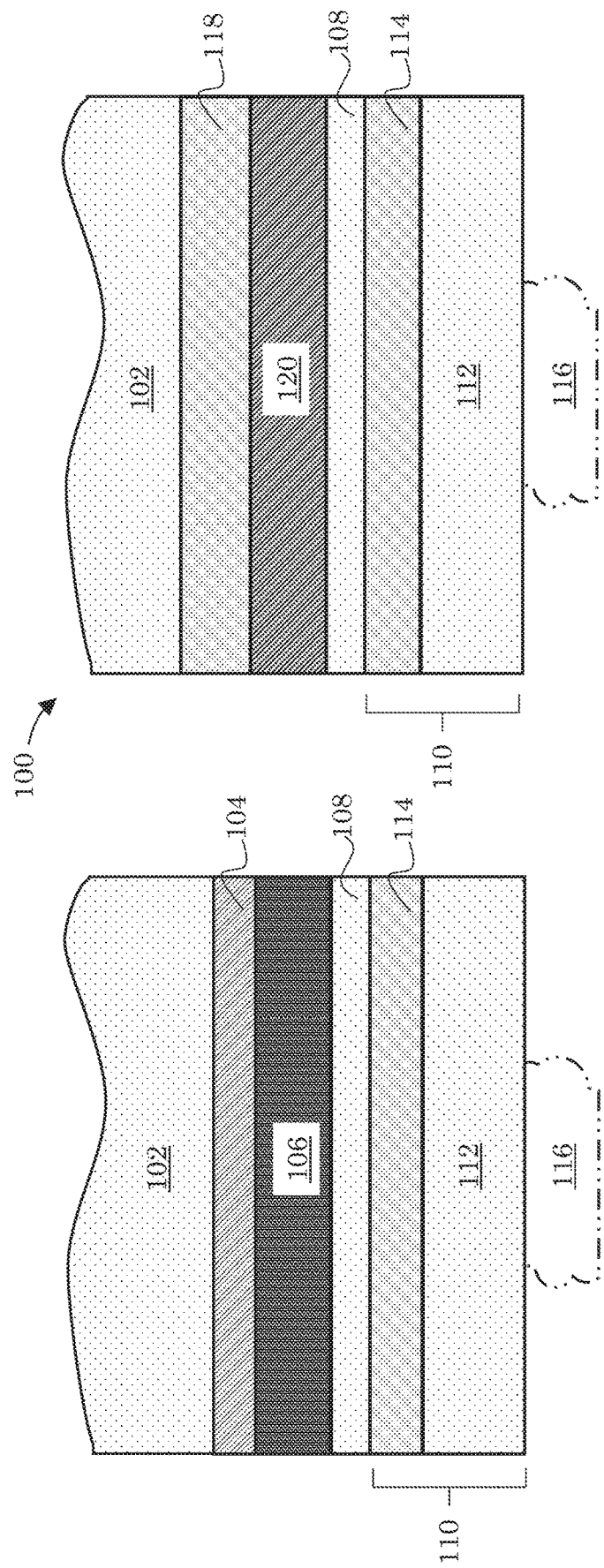

OHMIC CONTACTS AND METHODS FOR MANUFACTURING THE SAME

CROSS-REFERENCE TO RELATED APPLICATION(S)

The present application is the U.S. national stage entry, under 35 U.S.C. 071, of International Application No. PCT/US2019/013518, filed Jan. 14, 2019, which claims the benefit of priority of U.S. Provisional Patent Application No. 62/617,699 filed on Jan. 16, 2018 and U.S. Provisional Patent Application No. 62/668,476 filed on May 8, 2018, the contents of which are incorporated by reference herein in their entirety.

FIELD OF THE DISCLOSURE

The present disclosure relates to ohmic contacts bonded to substrates made of III-V semiconductors and to processes for fabricating the same.

BACKGROUND

Semiconductor devices often include a number of components having different mechanical and physical properties. For example, a vertical-cavity surface-emitting laser (VCSEL) may include a current-confining aperture composed of a ceramic material, such as aluminum oxide ($Al_2O_3$), embedded within a semiconductor material, such as gallium arsenide (GaAs), aluminum arsenide (AlAs), and aluminum gallium arsenide ($Al_xGa_{1-x}As$).

The physical properties of ceramics and semiconductors can be can be significantly different. For example, the coefficients of thermal expansion (CTE) of a ceramic current-confining aperture and the semiconductor material in which it is embedded, can be substantially different. In such instances, thermal stresses at the ceramic-semiconductor interface may develop during thermal treatments, for example, when bonding electrical contacts to the substrate. These stresses may be sufficient to create microstructural defects at the interface thereby resulting in reduced device lifetime.

Reducing the temperature of the thermal treatment can effectively reduce the thermal stresses developed at the interface. For example, thermal treatments for bonding electrical contacts at 350° C. often results in microstructural defects, while lower temperatures, such as 150-250° C. may result in fewer defects or the elimination of defects altogether.

Accordingly, contact materials are needed that result in ohmic electrical contacts following low-temperature thermal treatments. The ohmic contacts should resist degradation during operation and possess the same majority charge-carrier type (i.e., n- or p-type) as the substrate onto which it is bonded.

SUMMARY

This disclosure is directed to n-type ohmic electrical contacts bonded to n-type semiconductor substrates at low temperatures and methods for fabricating the same. In one aspect, for example, a process for manufacturing an n-type ohmic contact on an n-type semiconductor substrate includes the steps of:

depositing a reactant layer onto the n-type semiconductor substrate, the reactant layer including a metal reactant;

depositing an n-type dopant layer onto the reactant layer, the n-type dopant layer including an n-type dopant;

depositing a capping layer onto the reactant layer, the capping layer including a metal layer and a diffusion barrier layer; and heating the n-type semiconductor substrate, reactant layer, n-type dopant layer, and capping layer to a temperature such that the n-type dopant diffuses from the n-type dopant layer into the n-type semiconductor substrate forming an n-type dopant-rich interface layer, and the n-type dopant and the metal reactant inter-diffuse thereby forming a product layer adjacent to the n-type dopant-rich interface layer.

In some instances, processes for manufacturing the n-type ohmic contact further include the step of depositing an adhesion layer.

In another aspect, an n-type ohmic contact includes an n-type semiconductor substrate, and an n-type dopant-rich interface layer embedded within the n-type semiconductor substrate. The n-type dopant-rich interface layer includes an n-type dopant. The n-type ohmic contact further includes a product layer adjacent to the n-type dopant-rich interface layer. The product layer includes a metal reactant and the n-type dopant. The n-type ohmic contact further includes a capping layer adjacent to the product layer. The capping layer includes a metal layer and a diffusion barrier layer.

In some instances, the n-type ohmic contact further includes an adhesion layer between the product layer and the capping layer.

Other aspects, features, and advantages will be apparent from the following detailed description, the accompanying drawings, and the claims.

BRIEF DESCRIPTION OF THE DRAWINGS

FIG. 1A depicts an example of layers deposited onto a substrate prior to heating.

FIG. 1B depicts the example layers after heating.

DETAILED DESCRIPTION

FIG. 1A depicts a series of layers that when processed according to this disclosure, generate an n-type ohmic contact 100 with an n-type semiconductor substrate 102. The layers include a reactant layer 104, an n-type dopant layer 106, an adhesion layer 108, and a capping layer 110. The capping layer 110 includes a metal layer 112 and a diffusion barrier layer 114. The layers can be deposited by e-beam evaporation, sputtering, or thermal evaporation, though any suitable method may be used as would be apparent to a person of ordinary skill in the art.

The n-type semiconductor substrate 102 can be composed of one or more group III elements, one or more group V elements, and an n-type dopant. The example n-type semiconductor substrate 102 depicted in FIG. 1A and FIG. 1B is gallium arsenide (GaAs), though other III-V semiconductor materials are included within the scope of this disclosure, such as aluminum arsenide (AlAs), aluminum gallium arsenide ($Al_xGa_{1-x}As$), indium antimonide (InSb), and gallium antimonide (GaSb). The n-type dopant can include one or more donors, such as silicon, germanium, and tin doped to provide a carrier concentration suitable for a particular application. For example, when the n-type semiconductor substrate 102 is integrated into a vertical-cavity surface-emitting laser, the n-type dopant can be silicon doped to achieve a carrier concentration of between $1 \times 10^{17}/cm^3$ to $2 \times 10^{18}/cm^3$.

The reactant layer 104 includes a metal reactant (not depicted). The example metal reactant associated with the example reactant layer 104 depicted in FIG. 1A is palladium, though other elements are within the scope of this disclosure. For example, the metal reactant can be one or more elements selected from the group consisting of nickel, palladium, and platinum. The example reactant layer 104 depicted in FIG. 1A is 520 angstroms thick, however, other thicknesses are within the scope of this disclosure. For example, the metal reactant can be deposited such that the reactant layer 104 is between 300 and 620 angstroms.

The n-type dopant layer 106 includes an n-type dopant (not depicted). The n-type dopant can include one or more type of donors, such as silicon, germanium, and tin. In some instances, the n-type dopant is deposited such that the n-type dopant layer 106 is between 900 and 1860 angstroms. In some instances, the the n-type dopant layer 106 is between two and three times the thickness of the reactant layer 104. In some instances, the n-type dopant layer 106 is approximately 2.4 times the thickness of the reactant layer 102. The example n-type dopant layer 106 depicted in FIG. 1A is 1250 angstroms thick and the n-type dopant is germanium. The n-type dopant is configured to both diffuse through the reactant layer 104 and into the n-type semiconductor substrate 102, and to inter-mix with the reactant layer 104. Consequently, the composition and thickness of the n-type dopant layer 106 can be dependent on the desired amount of n-type dopant to diffuse into the n-type semiconductor substrate 102, the ratio of n-type dopant to metal reactant (e.g., within the reactant layer 104), and the temperature and duration of subsequent heat treatments.

The metal layer 112 within the capping layer 110 can include one or more elements selected from the group consisting of gold and silver. The example metal layer 112 depicted in FIG. 1A and FIG. 1B is gold. The one or more elements can be deposited such that the thickness of the metal layer is between 500 and 1500 angstroms. The example metal layer 112 is 1000 angstroms. The metal layer 112 is configured to provide a low-contact resistance substrate for additional electrical contacts. The example depicted in FIG. 1A and FIG. 1B includes solder 116 in electrical communication with other electrical contacts (not depicted). Other electrical contacts, such as plated gold, are included within the scope of this disclosure. In some instances, two to three microns of gold can be plated onto the metal layer 112.

The diffusion barrier layer 114 within the capping layer 110 can include one or more elements selected from the group consisting of nickel, palladium, and platinum. The element is deposited such that the thickness of the diffusion barrier layer 114 is between 650 and 850 angstroms. The example depicted in FIG. 1A and FIG. 1B includes platinum deposited such that the diffusion barrier layer 114 is 750 angstroms thick. The composition and thickness of the diffusion barrier layer 114 can vary according to application. For example, in some instances, the solder 116 can include a constituent (e.g., indium) that can readily diffuse through the layers and into the n-type semiconductor substrate 102 thereby destroying the semiconductor device (e.g., vertical-cavity surface-emitting laser) into which the n-type semiconductor substrate 102 is integrated. Consequently, the thickness and composition of the of the diffusion barrier layer 114 can depend strongly on factors affecting diffusion rates, such as the intended operating temperature of the semiconductor device, bonding/soldering temperatures, and the composition of the solder 116 or other electrical contacts.

The adhesion layer 108 can include one or more elements selected from the group consisting of titanium, zirconium, and hafnium. In some instances, the one or more elements can further include tungsten, tantalum, and/or molybdenum in an alloy, compound, mixture, or composite with any of the one or more elements selected from the group consisting of titanium, zirconium, and hafnium. For example, the adhesion layer 108 can include titanium tungstate (TiW). The one or more elements are deposited such that the thickness of the adhesion layer is between 300 and 5000 angstroms. The example adhesion layer 108 depicted in FIG. 1A and FIG. 1B includes titanium deposited such that the thickness of the adhesion layer 108 is 400 angstroms.

In some instances, the adhesion layer 108 is operable to prevent the inter-diffusion of the n-type dopant and the element within the diffusion barrier layer 114. Consequently, the thickness and composition of the adhesion layer 108 can depend on factors affecting diffusion rates, such as the composition of the n-type dopant layer 104 and the diffusion barrier layer 114, and the temperature and duration of thermal treatments.

In some instances, the adhesion layer 108 is operable as a stress-compensation layer or stress balancing layer. The adhesion layer 108 can be characterized by intrinsic stress operable to balance or counteract the intrinsic stresses within or at the interfaces of other components of the n-type ohmic contact 100 such as the n-type semiconductor substrate 100 or any components integrated into or on the n-type semiconductor substrate 100 (not depicted). In some instances, the adhesion layer 108 can be operable to balance or counteract thermal stresses within or at the interface of other components of the n-type ohmic contact 100. The adhesion layer 108 can be deposited with intrinsic stress via a technique known to impart intrinsic stress within the as-deposited material, such as sputtering. For example, the adhesion layer 108 can include sputtered titanium tungstate. In some instances, the adhesion layer 108 may be operable to prevent the inter-diffusion of the n-type dopant and may be further operable as a stress-compensation layer, while in other instances, the adhesion layer 108 may be omitted altogether.

FIG. 1B depicts the example n-type semiconductor substrate 102, reactant layer 104, n-type dopant layer 106, adhesion layer 108, and capping layer 110 following a thermal treatment. Following the thermal treatment, the n-type ohmic contact 100 is formed with the n-type semiconductor substrate 102. The n-type semiconductor substrate 102, reactant layer 104, n-type dopant layer 106, adhesion layer 108, and capping layer 110 are heated to a temperature, such as 150 to 250° C., within an inert (e.g., $N_2$, Ar) or reducing (95:5 $N_2$:H) atmosphere. The example n-type ohmic contact 100 depicted in FIG. 1B is the result of a thermal treatment at 250° C. in an $N_2$ atmosphere for 15 minutes. In some instances, slow ramp rates are employed to avoid thermal shock (e.g., ramp rates of 5-8° C./minute can be used).

As described above, the n-type dopant within the n-type dopant layer diffuses into the n-type semiconductor substrate 102 forming an n-type dopant-rich interface layer 118. Moreover, the n-type dopant and the metal reactant inter-diffuse forming a product layer 120. In some instances, the product layer 120 includes a product composed of the metal reactant and the n-type dopant in a 1:4 atomic ratio. In some instances, the product layer 120 is between 50% and 90% the thickness of the reactant layer 104.

Other modifications may be made to the foregoing implementations, and features described above in different implementations may be combined in the same implementation. Thus, other implementations are within the scope of the claims.

What is claimed is:

1. A process for manufacturing an n-type ohmic contact on a n-type semiconductor substrate, the process including the steps of:
   depositing a reactant layer onto the n-type semiconductor substrate, the reactant layer including a metal reactant;
   depositing an n-type dopant layer onto the reactant layer, the n-type dopant layer including an n-type dopant;
   depositing a capping layer onto the reactant layer, the capping layer including a metal layer and a diffusion barrier layer; and
   heating the n-type semiconductor substrate, reactant layer, n-type dopant layer, and capping layer to a temperature such that the n-type dopant diffuses from the n-type dopant layer into the n-type semiconductor substrate forming an n-type dopant-rich interface layer, and the n-type dopant and the metal reactant inter-diffuse thereby forming a product layer adjacent to the n-type dopant-rich interface layer.

2. The process of claim 1, further including the step of depositing an adhesion layer.

3. The process of claim 2, wherein the adhesion layer includes one or more elements selected from the group consisting of titanium, zirconium, and hafnium, wherein the element is deposited such that the thickness of the adhesion layer is between 300 and 500 angstroms.

4. The process of claim 1, wherein the n-type semiconductor substrate is composed of one or more group III elements, one or more group V elements, and one or more n-type dopants.

5. The process of claim 1, wherein the metal reactant includes one or more elements selected from the group consisting of nickel, palladium, and platinum, wherein the element is deposited such that the reactant layer thickness is a particular thickness.

6. The process of claim 5, wherein the n-type dopant includes one or more elements selected from the group consisting of silicon, germanium, and tin, wherein the element is deposited such that the thickness of the n-type dopant layer is between two and three times the particular thickness.

7. The process of claim 6, wherein the particular thickness is between 300 and 620 angstroms and the thickness of the n-type dopant layer is between 900 and 1860 angstroms.

8. The process of claim 1, wherein the metal layer includes one or more elements selected from the group consisting of gold and silver, wherein the element is deposited such that the thickness of the metal layer is between 500 and 1500 angstroms.

9. The process of claim 1, wherein the diffusion barrier layer includes one or more elements selected from the group consisting of nickel, palladium, and platinum, wherein the element is deposited such that the thickness of the diffusion barrier layer is between 650 and 850 angstroms.

10. The process of claim 1, wherein the n-type semiconductor substrate, reactant layer, n-type dopant layer, and capping layer are heated to the temperature in an inert or reducing atmosphere.

11. An n-type ohmic contact comprising:
    an n-type semiconductor substrate;
    an n-type dopant-rich interface layer embedded within the n-type semiconductor substrate, the n-type dopant-rich interface layer including an n-type dopant;
    a product layer adjacent to the n-type dopant-rich interface layer, the product layer including a metal reactant and the n-type dopant; and
    a capping layer adjacent to the product layer, the capping layer including a metal layer and a diffusion barrier layer.

12. The n-type ohmic contact of claim 11 further comprising an adhesion layer between the product layer and the capping layer.

13. The n-type ohmic contact of claim 12, wherein the adhesion layer includes one or more elements selected from the group consisting of titanium, zirconium, and hafnium, the thickness of the adhesion layer is between 300 and 5000 angstroms.

14. The n-type ohmic contact of claim 12, wherein the adhesion layer is operable to prevent inter-diffusion of the n-type dopant and/or operable as a stress-compensation layer.

15. The n-type ohmic contact of claim 14, wherein the adhesion layer includes titanium tungstate.

16. The n-type ohmic contact of claim 15, wherein the titanium tungstate is deposited onto the n-type dopant layer 106 by sputtering such that the titanium tungstate is characterized by an intrinsic stress.

17. The n-type ohmic contact of claim 11, wherein the product layer is composed of the metal reactant and the n-type dopant in a 1:4 atomic ratio, and the thickness of the product layer is between 150 and 558 angstroms.

18. The n-type ohmic contact of claim 11, wherein the n-type dopant includes one or more elements selected from the group consisting of silicon, germanium, and tin, and the metal reactant includes one or more elements selected from the group consisting of nickel, palladium, and platinum.

19. The n-type ohmic contact of claim 11, wherein the metal layer includes one or more elements selected from the group consisting of gold and silver, and the thickness of the metal layer is between two and three microns.

20. The n-type ohmic contact of claim 11, wherein the diffusion barrier layer includes an element selected from the group consisting of nickel, palladium, and platinum, and the thickness of the diffusion barrier layer is between 650 and 850 angstroms.

* * * * *